(12) United States Patent
Oka et al.

(10) Patent No.: US 8,575,745 B2
(45) Date of Patent: Nov. 5, 2013

(54) POWER SEMICONDUCTOR DEVICE, PRINTED WIRING BOARD, AND MECHANISM FOR CONNECTING THE POWER SEMICONDUCTOR DEVICE AND THE PRINTED WIRING BOARD

(75) Inventors: Seiji Oka, Tokyo (JP); Shiori Idaka, Tokyo (JP); Hiroshi Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 126 days.

(21) Appl. No.: 13/223,600

(22) Filed: Sep. 1, 2011

(65) Prior Publication Data

US 2012/0187554 A1 Jul. 26, 2012

(30) Foreign Application Priority Data

Jan. 20, 2011 (JP) ................. 2011-009539

(51) Int. Cl.
*H01L 23/48* (2006.01)
*H01L 23/04* (2006.01)

(52) U.S. Cl.
USPC ........... 257/693; 257/690; 257/697; 257/698; 257/E23.174

(58) Field of Classification Search
USPC ................ 257/690, 697, 698, 693, E23.174
See application file for complete search history.

(56) References Cited

U.S. PATENT DOCUMENTS

| 4,750,092 | A | * | 6/1988 | Werther | 361/783 |
| 4,823,234 | A | * | 4/1989 | Konishi et al. | 361/718 |
| 4,868,638 | A | * | 9/1989 | Hirata et al. | 257/697 |
| 4,890,152 | A | * | 12/1989 | Hirata et al. | 257/666 |
| 5,144,412 | A | * | 9/1992 | Chang et al. | 257/665 |
| 6,151,221 | A | | 11/2000 | Van Lerberghe | |
| 2001/0025964 | A1 | | 10/2001 | Loddenkotter et al. | |
| 2006/0097362 | A1 | * | 5/2006 | Wilmot et al. | 257/666 |

FOREIGN PATENT DOCUMENTS

| JP | 58-169878 | 10/1983 |
| JP | 1-159369 U | 11/1989 |
| JP | 7-297197 A | 11/1995 |
| JP | 2000-517485 | 12/2000 |
| JP | 2001-298129 | 10/2001 |
| JP | 2003-208941 | 7/2003 |
| JP | 2008-198597 | 8/2008 |

OTHER PUBLICATIONS

Office Action issued Dec. 6, 2012 in German Patent Application No. 10 2011 087 414.3 (with partial English translation).

* cited by examiner

*Primary Examiner* — Nitin Parekh
(74) *Attorney, Agent, or Firm* — Oblon, Spivak, McClelland, Maier & Neustadt, L.L.P.

(57) ABSTRACT

A power semiconductor device includes a conductive insertion member as an external terminal projecting from a surface of the power semiconductor device facing a printed wiring board. The printed wiring board includes a conductive fitting member mounted on a pad part of the printed wiring board. The fitting member receives the insertion member therein when the power semiconductor device is connected to the printed wiring board. The insertion member has a recessed portion formed on a side surface of the insertion member. The fitting member has a projecting portion with elasticity formed on an inner side surface of the fitting member. The elasticity causes the projecting portion of the fitting member to contact the recessed portion of the insertion member under pressure when the insertion member is inserted into the fitting member.

8 Claims, 6 Drawing Sheets

POWER SEMICONDUCTOR DEVICE, PRINTED WIRING BOARD, AND MECHANISM FOR CONNECTING THE POWER SEMICONDUCTOR DEVICE AND THE PRINTED WIRING BOARD

BACKGROUND OF THE INVENTION

1. Field of the Invention

The present invention relates to a structure for connecting a power semiconductor device and a printed wiring board to hold the power semiconductor device thereon.

2. Description of the Background Art

Regarding a power semiconductor device such as a power module, connection with small power loss between the power semiconductor device and an external printed wiring board, and efficient dissipation of heat generated from a power semiconductor element in the power semiconductor device to the outside, are believed to be essential requirements to control high current and high voltage. So, reduction in resistance in the power semiconductor device and of each wiring pattern on a printed substrate, reduction in connection resistance at each connecting part, and improvement in connection reliability have been important issues to be achieved.

Meanwhile, in terms of simplification of assembly, various techniques to easily and reliably connect a power semiconductor device and a printed wiring board have been suggested. As an example of such techniques, Japanese Patent Application Laid-Open No. 2001-298129 (patent literature 1) suggests a structure using a wire pin as an external terminal of a power semiconductor device and which projects from a surface of the power semiconductor device. In this structure, connection between a substrate (internal substrate) in the power semiconductor device and the wire pin is formed by inserting the wire pin into a metallic tubular member (bushing) formed on the internal substrate. Connection between the wire pin and an external printed wiring board is established by inserting the wire pin into a through hole in the printed wiring board, and by soldering (through-hole connection system).

Japanese Patent Application Laid-Open No. 2008-198597 (patent literature 2) employs a press contact system to establish connection between a power semiconductor device and a printed wiring board to simplify work of connection. Patent literature 2 uses a spring member (contact spring) formed by bending metal as an external terminal of the power semiconductor device.

In the structure of patent literature 1, the wire pin as an external terminal of the power semiconductor device is inserted into the bushing on the internal substrate, and is held by the force of friction between the wire pin and the inner surface of the bushing. This may result in failure to achieve connection reliability at a satisfactory high level between the internal substrate of the power semiconductor device and the external terminal. Further, use of the through-hole connection system to establish connection between the external terminal and the printed wiring board necessitates a step of defining a through hole during formation of the printed wiring board, and a soldering step when the power semiconductor device is mounted to the printed wiring board.

With regard especially to a power semiconductor device that controls high current, the need to increase the number of wire pins involves increase in the number of through holes and the number of parts to be soldered, leading to cost increase. The power semiconductor device controlling high current generates a great amount of heat. So, stress due to difference in heat expansion coefficient between the printed wiring board and wire pins may generate a crack in solder. Generation of a crack increases connection resistance between the wire pins and the printed wiring board and reduces connection strength, leading to a fear of reduction in reliability.

Patent literature 2 uses a contact spring as an external terminal of the power semiconductor device. The structure of the contact spring itself makes a contact area small with the wiring pattern of the internal substrate, or with a pad part of the printed wiring board, resulting in small current capacity of each external terminal. This increases the number of contact springs required in the power semiconductor device controlling high current, putting an obstacle to size reduction of the device. The contact spring extends a current flow path as it is formed by bending metal, disadvantageously resulting in large power loss.

SUMMARY OF THE INVENTION

It is an object of the present invention to provide a structure for connecting a power semiconductor device and an external printed wiring board capable of improving connection reliability, reducing power loss, reducing manufacturing cost, simplifying a connecting process, and reducing the size of the connection structure.

The present invention relates to a mechanism for connecting a power semiconductor device and a printed wiring board. The power semiconductor device includes a conductive insertion member as an external terminal projecting from a surface of the power semiconductor device facing the printed wiring board. The printed wiring board includes a conductive fitting member mounted on a pad part of the printed wiring board. The fitting member receives the insertion member therein when the power semiconductor device is connected to the printed wiring board. The insertion member has a recessed portion formed on a side surface of the insertion member. The fitting member has a projecting portion with elasticity formed on an inner side surface of the fitting member. The elasticity causes the projecting portion of the fitting member to contact the recessed portion of the insertion member under pressure when the insertion member is inserted into the fitting member.

According to the mechanism for connecting the power semiconductor device and the printed wiring board, the elasticity of the projecting portion of the fitting member causes the projecting portion to contact the recessed portion of the insertion member under pressure to provide mechanically strong connection, leading to high resistance to vibration and excellent long-term reliability. The projecting portion in abutting contact with the recessed portion increases a contact area between the fitting member and the insertion member, so that contact therebetween is established with low electrical loss while high thermal conductivity is obtained.

These and other objects, features, aspects and advantages of the present invention will become more apparent from the following detailed description of the present invention when taken in conjunction with the accompanying drawings.

EMBODIMENT FOR CARRYING OUT THE INVENTION

First Preferred Embodiment

Figure 1:
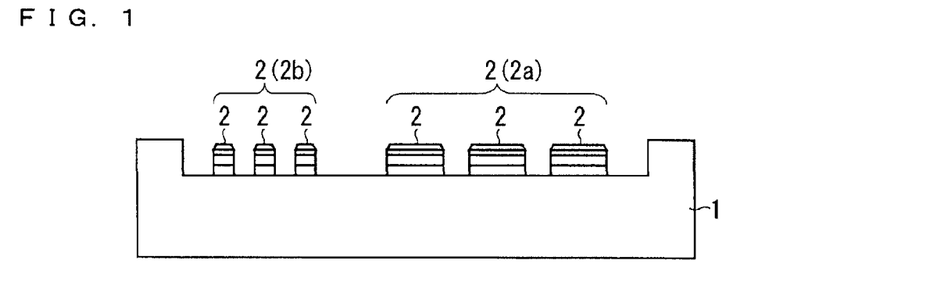
FIG. 1 shows the structure of a power semiconductor device of a first preferred embodiment of the present invention.

FIG. 1 shows the structure of a power semiconductor device 1 of a first preferred embodiment of the present invention. Conductive insertion members 2 made of metal and which function as external terminals are formed on the upper surface (surface to face a printed wiring board 3 described later) of the power semiconductor device 1. The insertion members 2 each project from the upper surface of the power semiconductor device 1, and they all have the same height.

The power semiconductor device 1 of FIG. 1 includes insertion members 2a of a relatively large width used as current terminals, and insertion members 2b of a relatively small width used as signal terminals. In the below, the "insertion member 2" indicates both the insertion member 2a as a current terminal and the insertion member 2b as a signal terminal, unless otherwise specified. The structure of the insertion member 2 is described in detail later.

Figure 2:
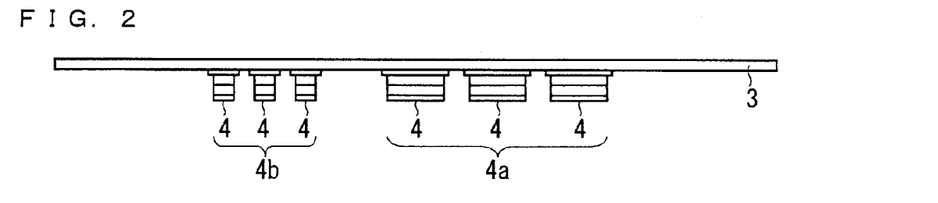
FIG. 2 shows the structure of a printed wiring board of the first preferred embodiment of the present invention.

FIG. 2 shows the structure of the printed wiring board 3 of the first preferred embodiment of the present invention. The power semiconductor device 1 of FIG. 1 is mounted to the printed wiring board 3. Conductive fitting members 4 made of metal to receive the insertion members 2 are formed on the lower surface (surface to face the power semiconductor device 1) of the printed wiring board 3, and at positions corresponding to those of the insertion members 2 of the power semiconductor device 1. The fitting members 4 each project from the lower surface of the printed wiring board 3, and they all have the same height.

The printed wiring board 3 of FIG. 2 includes fitting members 4a of a relatively large width used as current terminals and formed at positions corresponding to those of the insertion members 2a as current terminals of the power semiconductor device 1, and fitting members 4b of a relatively small width used as signal terminals and formed at positions corresponding to those of the insertion members 2b as signal terminals of the power semiconductor device 1. In the below, the "fitting member 4" indicates both the fitting member 4a as a current terminal and the fitting member 4b as a signal terminal, unless otherwise specified. The structure of the fitting member 4 is described in detail later.

Figure 3:
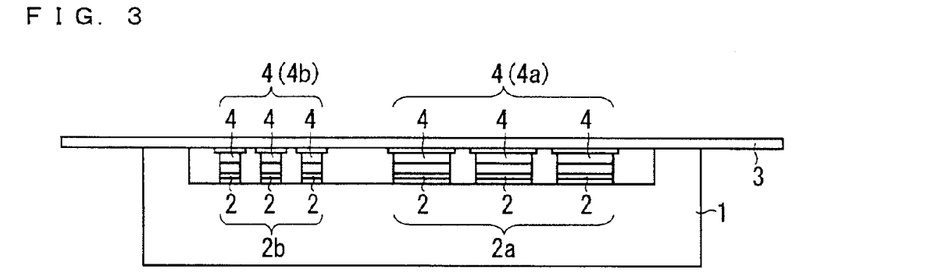
FIG. 3 shows how the power semiconductor device and the printed wiring board of the first embodiment are connected.

FIG. 3 shows the power semiconductor device 1 attached to the printed wiring board 3. For mounting of the power semiconductor device 1 to the printed wiring board 3, the power semiconductor device 1 and the printed wiring board 3 are aligned such that the insertion members 2 and the corresponding fitting members 4 face each other, and then the power semiconductor device 1 is pressed against the printed wiring board 3. This makes the insertion members 2 to be pressed into the fitting members 4, and held in the fitting members 4. As a result, the insertion members 2 and the fitting members 4 are electrically connected to each other, and the power semiconductor device 1 is fixed to the printed wiring board 3.

As an example, the power semiconductor device 1 and the printed wiring board 3 may be aligned with a screw hole (not shown) for attachment to a heat dissipation fin that penetrates the power semiconductor device 1 and the printed wiring board 3. For pressing of the power semiconductor device 1 against the printed wiring board 3, an attachment jig such as a flat metal plate may be used, for example. Placing a flat attachment jig along the lower surface (surface opposite to that on which the insertion members 2 are formed) of the power semiconductor device 1 can apply force uniformly to the entire lower surface of the power semiconductor device 1, thereby preventing generation of distortion in the power semiconductor device 1.

As described above, the plurality of insertion members 2 projecting from the power semiconductor device 1 have the same height, and the plurality of fitting members 4 formed on the printed wiring board 3 also have the same height. This allows force to be applied uniformly to all of the plurality of insertion members 2 and the fitting members 4 when the insertion members 2 are pressed into the fitting members 4, so that all the insertion members 2 can be inserted reliably into the corresponding fitting members 4.

Figure 4:
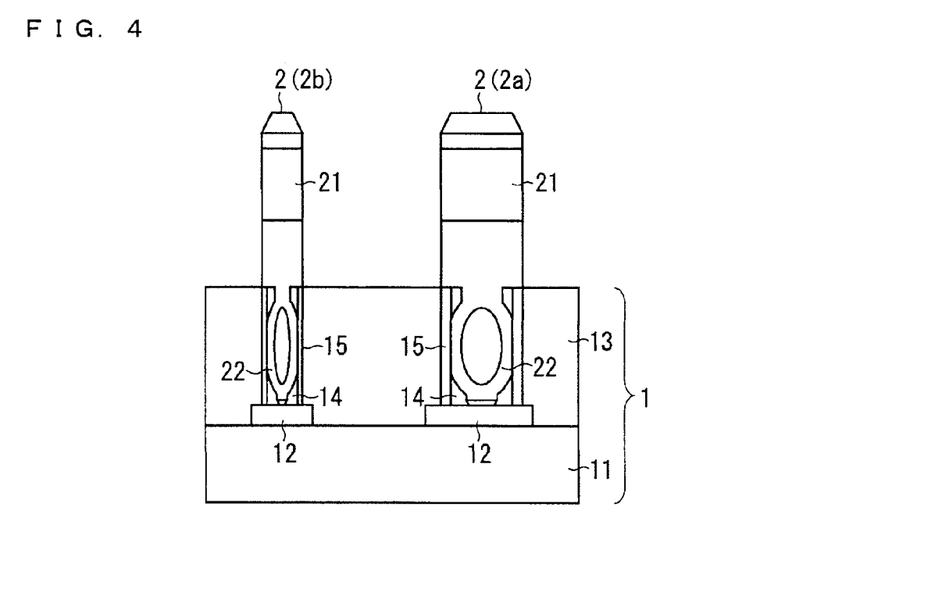
FIG. 4 is a sectional view showing insertion members of the power semiconductor device of the first preferred embodiment in an enlarged manner.

FIG. 4 is a sectional view showing the insertion members 2 and their vicinities of the power semiconductor device 1 in an enlarged manner. FIG. 4 includes the insertion member 2a as a current terminal, and the insertion member 2b as a signal terminal. In order to allow high current to flow, the insertion member 2a as a current terminal has a larger sectional area by being given a width larger than that of the insertion member 2b as a signal terminal. The insertion member 2a as a current terminal shown in FIG. 4 is given a larger width to increase the sectional area thereof. Meanwhile, the insertion member 2a may also be increased in thickness. Properly using the insertion members 2 of different widths or thicknesses depending on a purpose of use makes it possible to reduce the required number of insertion members 2 and an area to be occupied by the insertion members 2, thereby realizing size reduction of the power semiconductor device 1.

Figure 5:
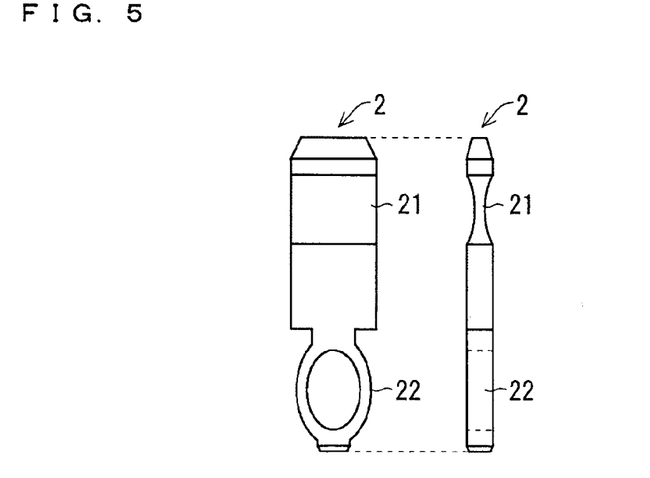
FIG. 5 shows front and side views of the insertion member of the first preferred embodiment.

FIG. 5 shows front and side views of the insertion member 2. The insertion member 2a as a current terminal and the insertion member 2b as a signal terminal only differ in width or thickness (as they have the same height as described above). So, in the below, they will not be discussed distinctively.

The power semiconductor device 1 is what is called a transfer molded module. As shown in FIG. 4, the power semiconductor device 1 includes an internal substrate 11 in which a semiconductor element is built, and a molding resin 13 that covers a surface of the internal substrate 11. Covering the power semiconductor device 1 with the molding resin 13 achieves reliability of insulation between the insertion members 2 at a high level. As an example, the molding resin 13 may be an epoxy resin filled with silica powder as a filler. The content rate of the silica powder is set at an optimum value determined in consideration for example of the heat expansion coefficients of members to form the power semiconductor device 1.

Openings 14 are formed at predetermined positions in the molding resin 13 that reach a wiring pattern 12 on the internal substrate 11. Metal bushings 15 electrically connected to the wiring pattern 12 are formed in the corresponding openings 14. the length of the bushings 15 is the same as the depth of the openings 14. To be specific, the bushings 15 have a bottom portion connected to the wiring pattern 12, and an upper portion reaching the upper surface of the molding resin 13.

As shown in FIG. 5, the insertion member 2 has recessed portions 21 formed on side surfaces of its upper part, and a press-fitted portion 22 formed at its lower part. The press-fitted portion 22 is slightly wider than the inner diameter of the bushing 15. The press-fitted portion 22 of the insertion member 2 is inserted into the bushing 15, thereby mounting the insertion member 2 to the power semiconductor device 1 as shown in FIG. 4. This establishes mechanical and electrical connection between the press-fitted portion 22 and the bushing 15. This also provides a high degree of accuracy of the position of the press-fitted portion 22 of the insertion member 2 inserted into the bushing 15, thereby improving the accuracy of alignment between the insertion member 2 and the fitting member 4.

For mechanical and electrical connection between the insertion member 2 and the bushing 15, techniques such as soldering and fastening with a spring may be applied as well as the press fitting system. Or, the lower part of the insertion member 2 (part to be inserted into the bushing 15) may be shaped into the form of a spring. Meanwhile, an external terminal of a power semiconductor device is required to maintain long-term reliability of joining and a high degree of position accuracy. So, joining by press fitting is believed to be an optimum way also in terms of other aspects such as processing cost, convenience of attachment, and current capacity. Thus, the first preferred embodiment employs the press fitting system.

Figure 6:
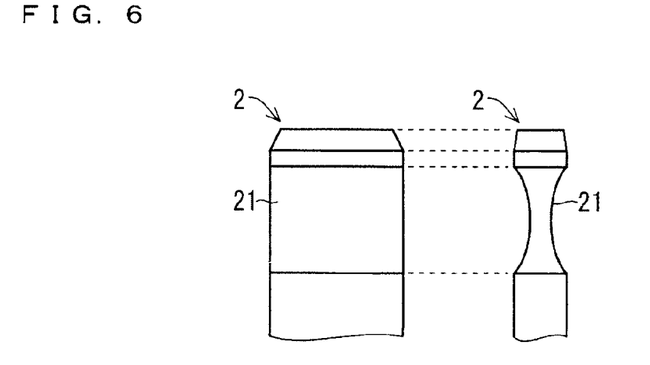
FIGS. 6 and 7 each show an example of recessed portions of the insertion member.
Figure 7:
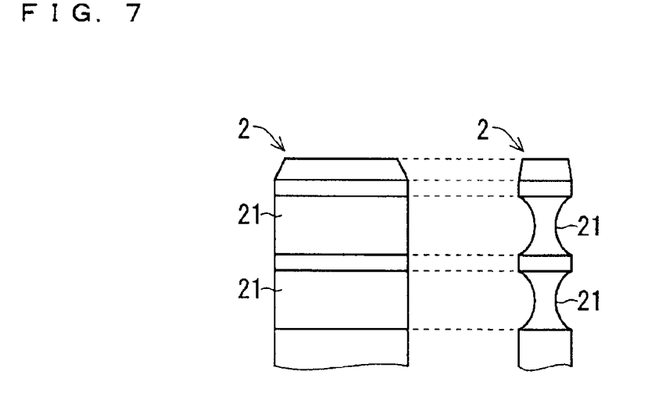

The recessed portions 21 of the insertion member 2 have curved surfaces in the form of an R (rounded) shape, and which are formed symmetrically on opposite side surfaces of the insertion member 2. The recessed portions 21 may be provided only in a pair as shown in FIG. 6. The recessed portions 21 may also be provided in two pairs as shown in FIG. 7, or a larger number of recessed portions 21 may be provided. The shape of the fitting member 4 described later is responsive to the positions, size, and the number of the recessed portions 21 of the insertion member 2.

As seen from the side view of the insertion member 2 shown in FIG. 5, the insertion member 2 is made of a flat metal plate (with no bend). The flat shape of the insertion member 2 causes current in the insertion member 2 to flow through a shortest possible path, thereby allowing low loss, low inductance, and high current of an external terminal of the power semiconductor device 1. The insertion member 2 is formed by processing one metal plate and it has no connecting part inside accordingly, resulting in low current loss.

Figure 8:
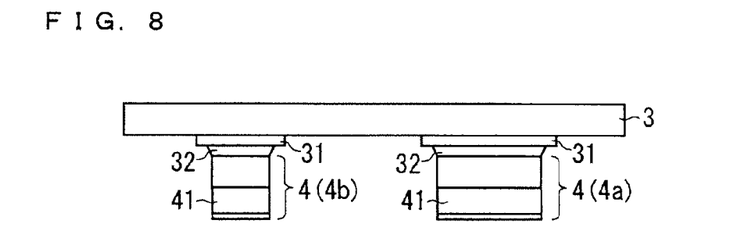
FIG. 8 is a sectional view showing fitting members of the printed wiring board of the first preferred embodiment in an enlarged manner.

FIG. 8 is a sectional view showing the fitting members 4 and their vicinities of the printed wiring board 3 in an enlarged manner. FIG. 8 includes the fitting member 4a as a current terminal, and the fitting member 4b as a signal terminal. The fitting member 4a as a current terminal is arranged at a position corresponding to that of the insertion member 2a as a current terminal of the power semiconductor device 1. The fitting member 4a has a large width to conform to the insertion member 2a as a current terminal. The fitting member 4b as a signal terminal is arranged at a position corresponding to that of the insertion member 2b as a signal terminal of the power semiconductor device 1. The fitting member 4b has a small width to conform to the insertion member 2b as a signal terminal.

In FIG. 8, the fitting member 4a as a current terminal is shown to be greater in width than the fitting member 4b as a signal terminal in response to the insertion member 2a as a current terminal greater in width than the insertion member 2b as a signal terminal as shown in FIG. 4. If the insertion member 2a as a current terminal is greater in thickness than the insertion member 2b as a signal terminal, for example, the depth of the fitting member 4a as a current terminal (distance between arm parts) may be increased. The fitting member 4a as a current terminal and the fitting member 4b as a signal terminal differ only in width or depth (as they have the same height as described above). So, in the below, they will not be discussed distinctively.

As shown in FIG. 8, the fitting members 4 are joined through solder 32 to corresponding pad parts 31 that are part of a printed wiring formed on a surface of the printed wiring board 3. For reduction in thermal resistance and electric resistance, the thickness of the solder 32 is preferably reduced to a level that does not deteriorate joining reliability. Resistance can be reduced further if silver nano paste is used in place of the solder 32 to join the pad parts 31 and the fitting members 4. Although not shown, other members to be mounted such as a resistor are soldered to the surface of the printed wiring board 3. So, the number of manufacturing steps is not increased if soldering of the fitting members 4 to the pad parts 31 and soldering of the other members are performed in the same step, thereby preventing cost increase.

Figure 9A:
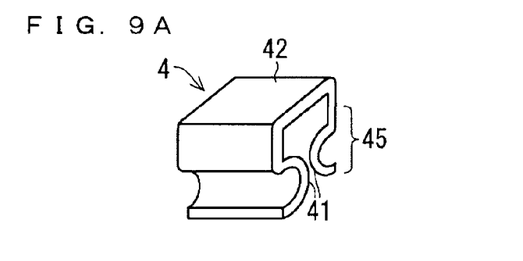
FIGS. 9A and 9B, FIGS. 10A and 10B, and FIGS. 11A and 11B each show an exemplary shape of the fitting member.
Figure 9B:
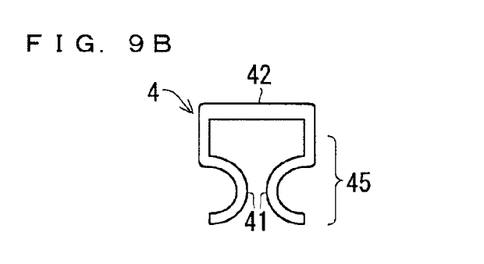

FIGS. 9A and 9B are perspective and sectional-views respectively of the fitting member 4. The fitting member 4 is in the form of a clip with an opening on the side opposite to a joint surface 42 joined to the pad part 31. The insertion member 2 of the power semiconductor device 1 is held between arm parts 45 in a pair of the fitting member 4. That is, the fitting member 4 is a clip electrode with the arm parts 45 in a pair extending in a direction perpendicular to a surface of the pad part 31.

The arm parts 34 of the fitting member 4 are given elastic projecting portions 41 that project into inner surfaces facing each other. The projecting portions 41 of the arm part 45 have curved surfaces in the form of an R (rounded) shape. The positions, size, and the number of the projecting portions 41 are determined in response to the corresponding recessed portions 21 of the insertion member 2. As an example, the projecting portions 41 are provided in a pair as shown in FIG. 9 if the insertion member 2 has one pair of recessed portions 21 as shown in FIG. 6.

A distance between the projecting portions 41 in a pair is set to be smaller than the thickness of the insertion member 2 at the recessed portions 21 to be held between the projecting portions 41. Inserting the insertion member 2 into the fitting member 4 causes the arm parts 45 of the fitting member 4 to hold the insertion member 2 therebetween, thereby connecting the insertion member 2 and the fitting member 4 mechanically and electrically. At this time, the projecting portions 41 of the fitting member 4 are pressed against the recessed portions 21 of the insertion member 2 by the elastic force of the projecting portions 41 to provide strong mechanical connection, so that the insertion member 2 will not be detached from the fitting member 4.

Figure 10A:
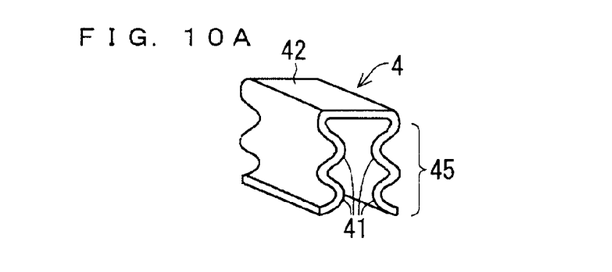
Figure 10B:
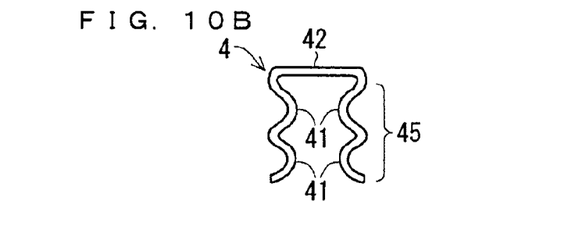

FIGS. 10A and 10B are perspective and sectional views respectively of the fitting member 4 with the arm parts 45 having the projecting portions 41 in two pairs. The fitting member 4 of this structure is employed if the insertion member 2 has two pairs of recessed portions 21 as shown in FIG. 7.

Conformance of the positions, shape and others of the projecting portions 41 of the arm parts 45 of the fitting member 4 to the positions, shape and others of the recessed portions 21 of the insertion member 2 increases a contact area between the fitting member 4 and the insertion member 2 when the insertion member 2 is inserted into the fitting member 4. This establishes connection between the insertion member 2 and the fitting member 4 with low electrical loss while achieving high thermal conductivity, favorably contributing to higher current of the power semiconductor device 1. The connection between the insertion member 2 and the fitting member 4 is established by pressing force applied from the projecting portions 41, leading to high resistance to vibration and excellent long-term reliability.

Figure 11A:
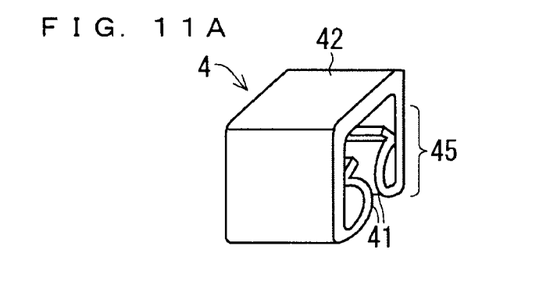
Figure 11B:
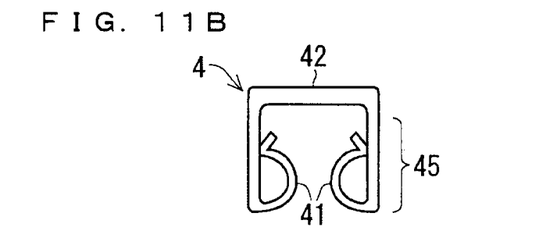

FIGS. 11A and 11B are perspective and sectional views respectively of a different exemplary structure of the fitting member 4. The fitting member 4 of FIGS. 11A and 11B has a pair of projecting portions 41 at the arm parts 45, so it is suitably applied to the insertion member 2 having a pair of recessed portions 21 as shown in FIG. 6. The projecting portions 41 of the fitting member 4 shown in FIGS. 11A and 11B are formed at folded sections of the arm parts 45, and are smaller in thickness than the other section (section in the form of a square-cornered U shape).

If the fitting member 4 has the shape shown in FIGS. 11A and 11B, the projecting portions 41 are deformed by pressing force applied to the insertion member 2 whereas substantially no deformation is generated in the other section including the joint surface 42 when the fitting member 4 receives the insertion member 2 therein. No deformation of the joint surface 42 prevents application of stress to the solder 32 between the fitting member 4 and the pad part 31, so that connection is established with a higher degree of reliability. Regarding the fitting member 4 shown in FIGS. 9A and 9B, or in FIGS. 10A and 10B, the joint surface 42 with the pad part 31 is preferably made thicker to prevent generation of stress in the solder 32.

In order to achieve the elasticity of the projecting portions 41, the physical characteristics of a material of the fitting member 4 preferably include high tensile strength as well as small electric resistance. A copper alloy may be used as such a material, for example.

Figure 12:
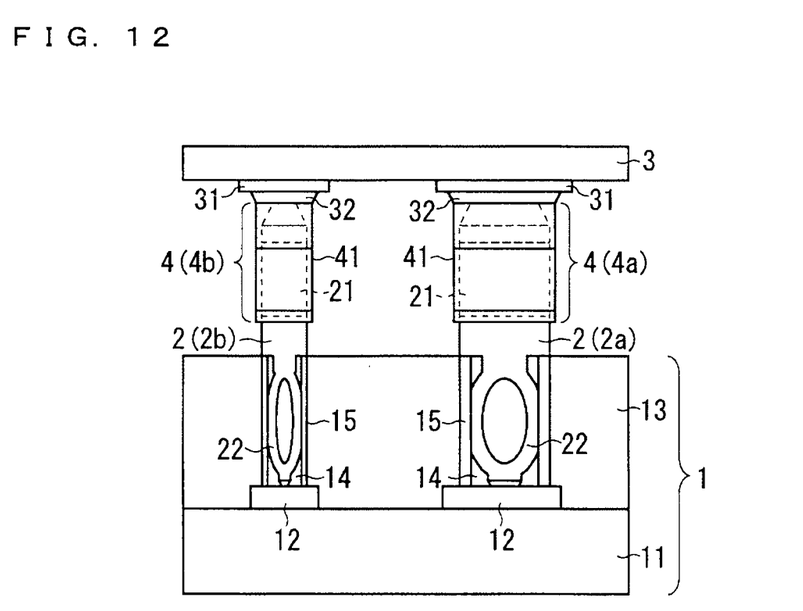
FIG. 12 shows how the insertion members are inserted into the fitting members in the first preferred embodiment.

FIG. 12 shows the insertion members 2 and the fitting members 4 in an enlarged manner in a state where the power semiconductor device 1 is attached to the printed wiring board 3. As described above, the insertion members 2 as external terminals of the power semiconductor device 1 are inserted into the fitting members 4 mounted on the printed wiring board 3. At this time, the projecting portions 41 of the fitting members 4 hold the recessed portions 21 of the insertion members 2 therebetween, thereby providing mechanically strong connection. The structures of the recessed portions 21 of the insertion members 2 and the projecting portions 41 of the fitting members 4 including position, size and shape conform to each other, thereby increasing contact areas between the insertion members 2 and the fitting members 4. Thus, connection is established with low electrical loss and favorable thermal conductivity. That is, the first preferred embodiment achieves mechanically, electrically, and thermally excellent connection.

Second Preferred Embodiment

Figure 13:
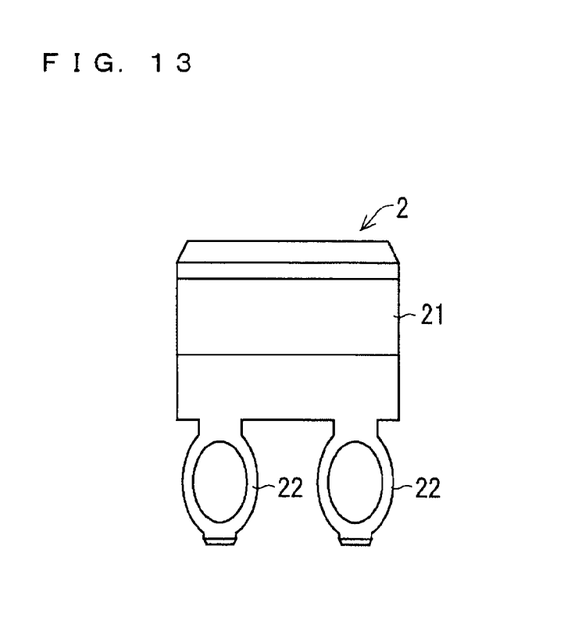
FIG. 13 shows the structure of an insertion member of a second preferred embodiment.

A second preferred embodiment is a modification of the structure of the insertion member 2 as an external terminal of the power semiconductor device 1. FIG. 13 shows the structure of the insertion member 2 of the second preferred embodiment. The insertion member 2 of the second embodiment is greater in width than the insertion member 2 of the first preferred embodiment (FIG. 5), and which has a plurality of (here, two) press-fitted portions 22. The insertion member 2 of the second preferred embodiment is the same in other respects as the insertion member 2 of the first preferred embodiment.

Figure 14:
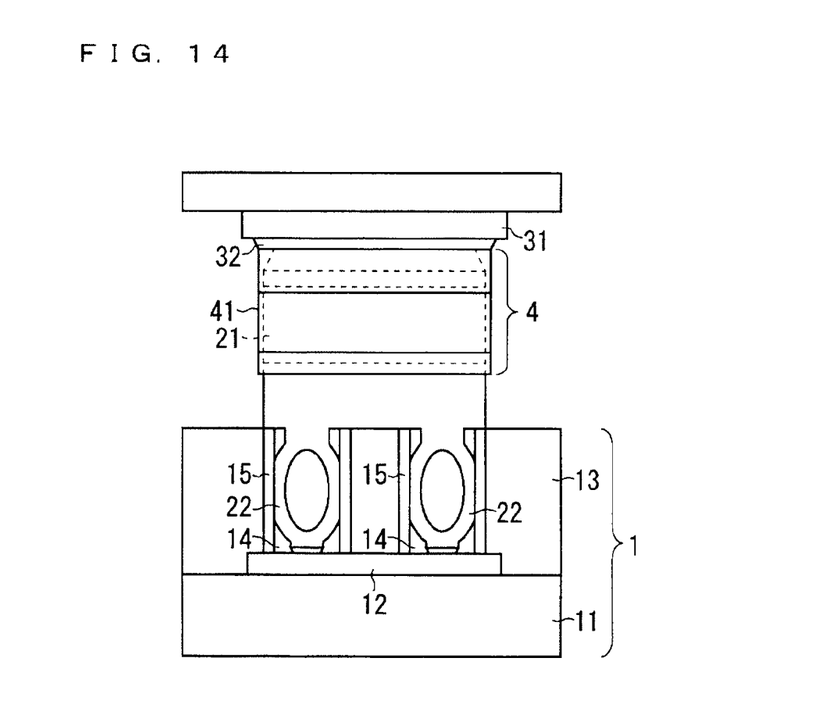
FIG. 14 shows how the insertion member is inserted into a fitting member in the second preferred embodiment.

FIG. 14 shows the insertion member 2 and the fitting member 4 in an enlarged manner in a state where the power semiconductor device 1 with the insertion member 2 of the second preferred embodiment is attached to the printed wiring board 3. The positions of the openings 14 and the bushings 15 formed in the molding resin 13 covering the power semiconductor device 1 correspond to those of the two press-fitted portions 22 of the insertion member 2. The fitting member 4 of the printed wiring board 3 to hold the insertion member 2 therebetween is made wider in response to the width of the insertion member 2.

The insertion member 2 of a large width can generate flow of high current. However, if the insertion member 2 has only one press-fitted portion 22 connected to the wiring pattern 12 of the power semiconductor device 1, nonuniform current distribution may be generated in the insertion member 2 of a large width, resulting in a problem of failure to obtain desired current capacity. In response, the insertion member 2 of the second preferred embodiment has a plurality of press-fitted portions 22 to provide uniform current distribution in the insertion member 2, thereby solving the aforementioned problem.

The insertion member 2 of a large width has an advantage over use of a large number of insertion members 2 of a small width as it achieves higher current capacity while occupying a smaller area.

Third Preferred Embodiment

Figure 15:
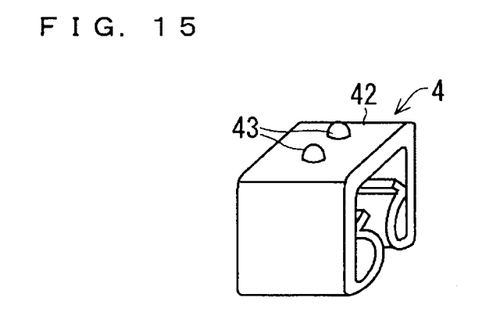
FIGS. 15 and 16 each show the structure of a fitting member of a third preferred embodiment.

A third preferred embodiment is a modification of the structure of the fitting member 4 mounted on the printed wiring board 3. FIG. 15 shows an exemplary structure of the fitting member 4 of the third preferred embodiment including projections 43 for alignment formed on the joint surface 42 of the fitting member 4. Although not shown, recesses for alignment are defined in advance by etching and the like in the pad part 31 to fixedly receive the fitting member 4, and at positions corresponding to those of the projections 43. The pad part 31 and the fitting member 4 are aligned with each other by fitting the projections 43 into the recesses in the pad part 31, thereby allowing easy and accurate alignment.

Figure 16:
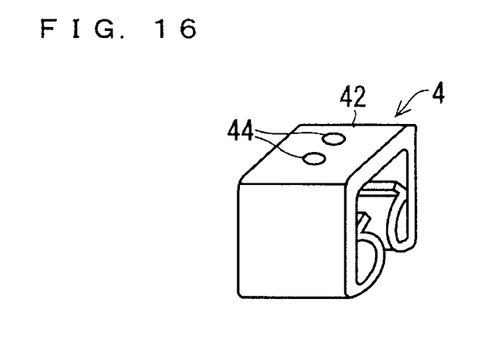

FIG. 15 shows the projections 43 for alignment formed on the joint surface 42 of the fitting member 4. Meanwhile, recesses 44 for alignment may alternatively be defined in the joint surface 42 of the fitting member 4 as shown in FIG. 16. In this case, projections for alignment are formed on the pad part 31 to fixedly receive the joint surface 42, and at positions corresponding to those of the recesses 44. The pad part 31 and the fitting member 4 are aligned with each other by making the recesses 44 abut on the projections of the pad part 31. This also allows easy and accurate alignment.

Fourth Preferred Embodiment

A semiconductor element using a wide band gap semiconductor typified by silicon carbide (SiC) is believed to be a promising semiconductor element as a next-generation switching element capable of achieving high breakdown voltage, low loss, and high resistance to heat. This semiconductor element is expected to be applied in a power semiconductor device such as an inverter. Examples of the wide band gap semiconductor include gallium nitride (GaN) based materials and diamond as well as SiC.

As described above, the mechanism for connecting the power semiconductor device 1 and the printed wiring board 3 of the present invention by using the insertion members 2 and the fitting members 4 realizes electrically and thermally excellent connection, thereby contributing largely to higher current of the power semiconductor device 1. So, the mechanism for connection of the present invention is believed to achieve a higher degree of effectiveness if it is applied in the power semiconductor device 1 that controls high current. Thus, the present invention is expected to be more effective and a wide band gap semiconductor device is allowed to exercise its potential satisfactorily if the wide band gap semiconductor device is employed as the power semiconductor device 1 to which the present invention is applied.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device, comprising:
   an internal substrate in which a semiconductor element is formed;
   a molding resin covering a top surface of said internal substrate;
   an opening penetrating said molding resin to reach a wiring on said internal substrate;
   a metal bushing formed in said opening, the metal bushing being electrically connected to said wiring; and
   an external terminal, at least a portion of the external terminal projecting from said opening,
   said external terminal having a press-fitted portion inserted into said bushing, and a recessed portion formed on a side surface of part of said external terminal, the part projecting from said opening.

2. The power semiconductor device according to claim 1, wherein said recessed portion is formed on each one of opposite side surfaces of said external terminal.

3. The power semiconductor device according to claim 1, wherein said recessed portion has a surface in the form of an R shape.

4. The power semiconductor device according to claim 1, wherein said external terminal includes a plurality of press-fitted portions.

5. The power semiconductor device according to claim 1, wherein said external terminal is constructed of a metal plate with no bend.

6. The power semiconductor device according to claim 1, wherein said power semiconductor device includes a plurality of external terminals having different sectional areas.

7. The power semiconductor device according to claim 1, wherein said power semiconductor device includes a plurality of external terminals, said plurality of external terminals all having the same height.

8. The power semiconductor device according to claim 1, wherein said power semiconductor device comprises a wide band gap semiconductor.

* * * * *